(12) United States Patent
Kohiro et al.

(10) Patent No.: US 8,169,004 B2
(45) Date of Patent: May 1, 2012

(54) COMPOUND SEMICONDUCTOR EPITAXIAL SUBSTRATE AND PROCESS FOR PRODUCING THE SAME

(75) Inventors: Kenji Kohiro, Tsukuba (JP); Tomoyuki Takada, Tsukuba (JP); Kazumasa Ueda, Tsuchiura (JP); Masahiko Hata, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 11/597,613

(22) PCT Filed: May 26, 2005

(86) PCT No.: PCT/JP2005/010090
§ 371 (c)(1),
(2), (4) Date: Nov. 27, 2006

(87) PCT Pub. No.: WO2005/117076
PCT Pub. Date: Dec. 8, 2005

(65) Prior Publication Data
US 2007/0215905 A1 Sep. 20, 2007

(30) Foreign Application Priority Data
May 31, 2004 (JP) .................. 2004-160847

(51) Int. Cl.
H01L 21/20 (2006.01)
(52) U.S. Cl. .................. 257/194; 257/E21.126
(58) Field of Classification Search .................. 257/183, 257/190, 192, 194, E29.091, E29.246, E29.249
See application file for complete search history.

(56) References Cited

U.S. PATENT DOCUMENTS

| | | | |
|---|---|---|---|
| 5,282,218 A | | 1/1994 | Okajima et al. |
| 5,391,896 A | * | 2/1995 | Wanlass .................. 257/80 |
| 5,441,913 A | * | 8/1995 | Hata et al. .................. 117/89 |
| 5,832,018 A | * | 11/1998 | Ohkubo .................. 372/45.011 |
| 2002/0067750 A1 | * | 6/2002 | Rice et al. .................. 372/45 |
| 2003/0209717 A1 | * | 11/2003 | Okazaki .................. 257/80 |
| 2004/0169194 A1 | * | 9/2004 | Noda .................. 257/192 |

(Continued)

FOREIGN PATENT DOCUMENTS

JP 5-144727 A 6/1983

(Continued)

OTHER PUBLICATIONS

Japanese Office Action dated Aug. 31, 2010 for Application No. 2004-160847.

(Continued)

*Primary Examiner* — Evan Pert
*Assistant Examiner* — Selim Ahmed
(74) *Attorney, Agent, or Firm* — Birch, Stewart, Kolasch & Birch, LLP

(57) ABSTRACT

A compound semiconductor epitaxial substrate and a process for producing the same are provided. The compound semiconductor epitaxial substrate comprises a single crystal substrate, a lattice mismatch compound semiconductor layer and a stress compensation layer, wherein the lattice mismatch compound semiconductor layer and the stress compensation layer are disposed on the identical surface side of the single crystal substrate, there is no occurrence of lattice relaxation in the lattice mismatch compound semiconductor layer, as well as the stress compensation layer, and Ls representing the lattice constant of the single crystal substrate, Lm representing the lattice constant of the lattice mismatch compound semiconductor layer, and Lc representing the lattice constant of the stress compensation layer satisfy the formula (1a) or (1b).

$$Lm\ Lm > Ls > Lc \qquad (2a)$$

5 Claims, 7 Drawing Sheets

U.S. PATENT DOCUMENTS

2006/0220165 A1 * 10/2006 Hase .............................. 257/471

FOREIGN PATENT DOCUMENTS

| JP | 62-196813 A | 8/1987 |
| JP | 3-21093 A | 1/1991 |
| JP | 5-55707 A | 3/1993 |
| JP | 5-63291 A | 3/1993 |
| JP | 06-244217 A | 9/1994 |
| JP | 06244217 A * | 9/1994 |
| JP | 9-148682 A | 6/1997 |
| JP | 2003-86520 A | 3/2003 |
| JP | 2003086520 A * | 3/2003 |
| JP | 2003-113000 A | 4/2003 |

OTHER PUBLICATIONS

Japanese Application No. 2004-160847, Office Action, Apr. 12, 2011; pp. 1-2.

* cited by examiner

COMPOUND SEMICONDUCTOR EPITAXIAL SUBSTRATE AND PROCESS FOR PRODUCING THE SAME

TECHNICAL FIELD

The present invention relates to a compound semiconductor epitaxial substrate and a process for producing the substrate. And furthermore, the invention relates to a semiconductor device comprising the compound semiconductor epitaxial substrate and a method of preventing warpage in the substrate.

BACKGROUND ART

Compound semiconductor epitaxial substrates are used for the producing devices such as high electron mobility field-effect transistors (HEMTs), pseudomorphic HEMTs (pHEMTs), strain quantum well laser devices, hetero bipolar transistors (HBTs) which are used as switches in cellular phones and so on. Such compound semiconductor epitaxial substrates are produced by epitaxially growing on single crystal substrates compound semiconductors with lattice constants different from those of the single crystal substrates.

In a case where compound semiconductors with lattice constants largely different from those of single crystal substrates are grown on the single crystal substrates, the layers of the semiconductors do not grow or even if the layers grow, a large amount of dislocation occurs due to the occurrence of lattice relaxation. Because of this, compound semiconductor epitaxial substrates made by using such compound semiconductors have not been heretofore used for producing those devices.

On the other hand, in a case where substances with lattice constants slightly different from those of single crystal substrates are grown on the single crystal substrates, when the substances is sufficiently thin, the occurrence of dislocation is prevented due to the strain of their lattices, and therefore the substances can be epitaxially grown on the single crystal substrates. However, in the compound semiconductor epitaxial substrates thus obtained, warpage occurs due to stress resulting from lattice strain which occurs in the crystal lattices the compound semiconductors.

DISCLOSURE OF THE INVENTION

The present inventors conducted extensive studies on a compound semiconductor epitaxial substrate with reduced warpage. As a result, the present invention has been completed.

That is, the invention provides a compound semiconductor epitaxial substrate comprising a single crystal substrate, a lattice mismatch compound semiconductor layer and a stress compensation layer, wherein the lattice mismatch compound semiconductor layer and the stress compensation layer are disposed on the identical surface side of the single crystal substrate, there is no occurrence of lattice relaxation in the lattice mismatch compound semiconductor layer, as well as the stress compensation layer, and Ls representing the lattice constant of the single crystal substrate, Lm representing the lattice constant of the lattice mismatch compound semiconductor layer, and Lc representing the lattice constant of the stress compensation layer satisfy the formula (1a) or (2a).

$$Lm<Ls<Lc \tag{1a}$$

$$Lm>Ls>Lc \tag{2a}$$

The invention provides a semiconductor device comprising the above compound semiconductor epitaxial substrate.

And further, the invention provides a process for producing a compound semiconductor epitaxial substrate comprising the steps of (1) and (2):

(1) epitaxially growing on a single crystal substrate a compound semiconductor layer I in which no lattice relaxation occurs, and (2) epitaxially growing on the obtained compound semiconductor layer I a compound semiconductor layer II in which no lattice relaxation occurs, wherein Ls representing the lattice constant of the single crystal substrate, $L_I$ representing the lattice constant of the compound semiconductor layer I, and $L_{II}$ representing the lattice constant of the compound semiconductor layer II satisfy the formula (1b) or (2b).

$$L_I<Ls<L_{II} \tag{1b}$$

$$L_I>Ls>L_{II} \tag{2b}$$

Furthermore, the invention provides a method of preventing warpage in a compound semiconductor epitaxial substrate comprising the steps of:

disposing on a single crystal substrate a compound semiconductor layer I in which there is no occurrence of lattice relaxation and disposing on the compound semiconductor layer I a compound semiconductor layer II in which there is no occurrence of lattice relaxation wherein Ls representing the lattice constant of the single crystal substrate, $L_I$ representing the lattice constant of the compound semiconductor layer I, and $L_{II}$ representing the lattice constant of the compound semiconductor layer II satisfy the above formula (1b) or (2b).

The compound semiconductor epitaxial substrate according to the invention is suitably used for producing electric devices such as HEMTs and HBTs because of its reduced warpage.

By using the process according to the invention, the compound semiconductor epitaxial substrate can be produced.

In addition, the process according to the invention does not require the step of disposing a layer on the rear surface of the single crystal substrate unlike, for example, a process described in JP-A No. 2003-113000 (the process includes the steps of adhering aluminum nitride to the rear surface of a sapphire substrate and then placing the sapphire substrate into a MOVPE apparatus to grow a GaN layer on the front surface of the sapphire substrate) and therefore is simple.

BEST MODE FOR CARRYING OUT THE INVENTION

A compound semiconductor epitaxial substrate according to the present invention is a compound semiconductor epitaxial substrate having a lattice mismatch compound semiconductor layer which is formed by epitaxially growing a compound semiconductor on a single crystal substrate, which differs from the single crystal substrate in lattice constant, and in which no lattice relaxation occurs. The compound semiconductor epitaxial substrate is made of the compound semiconductor which differs in material from the lattice mismatch compound semiconductor layer and which is opposite in the magnitude relation between its lattice constant and the single crystal substrate's lattice constant to the lattice mismatch compound semiconductor layer. In addition, the compound semiconductor epitaxial substrate has a stress compensation layer (in which no lattice relaxation occurs) on the same surface side as that of the lattice mismatch compound semiconductor layer of the single crystal substrate.

The stress compensation layer is formed by epitaxially growing a compound semiconductor on the single crystal substrate and differs from the single crystal substrate in lattice constant. An further, the stress compensation layer is made of the compound semiconductor which differs in material from the lattice mismatch semiconductor layer (in which no lattice relaxation occurs) and which is opposite in the magnitude relation between its lattice constant and the single crystal substrate's lattice constant to lattice mismatch compound semiconductor layer. Still further, the stress compensation layer, in which no lattice relaxation occurs, exerts on the single crystal substrate a stress which is opposite in direction to a stress resulting from lattice strain which occurs in the lattice mismatch compound semiconductor layer.

Figure 1:
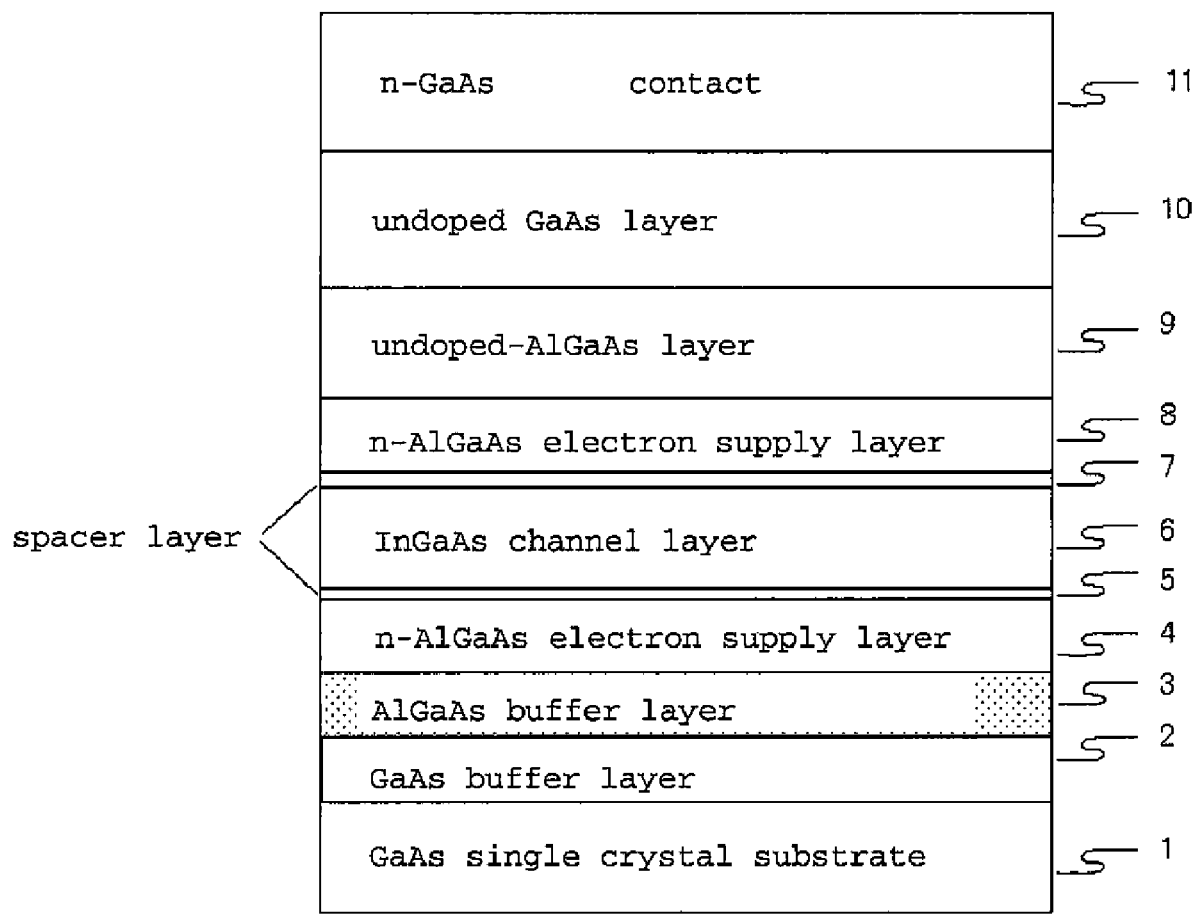
FIG. 1 shows the structure of a conventional compound semiconductor epitaxial substrate for HEMTs.
Figure 4:
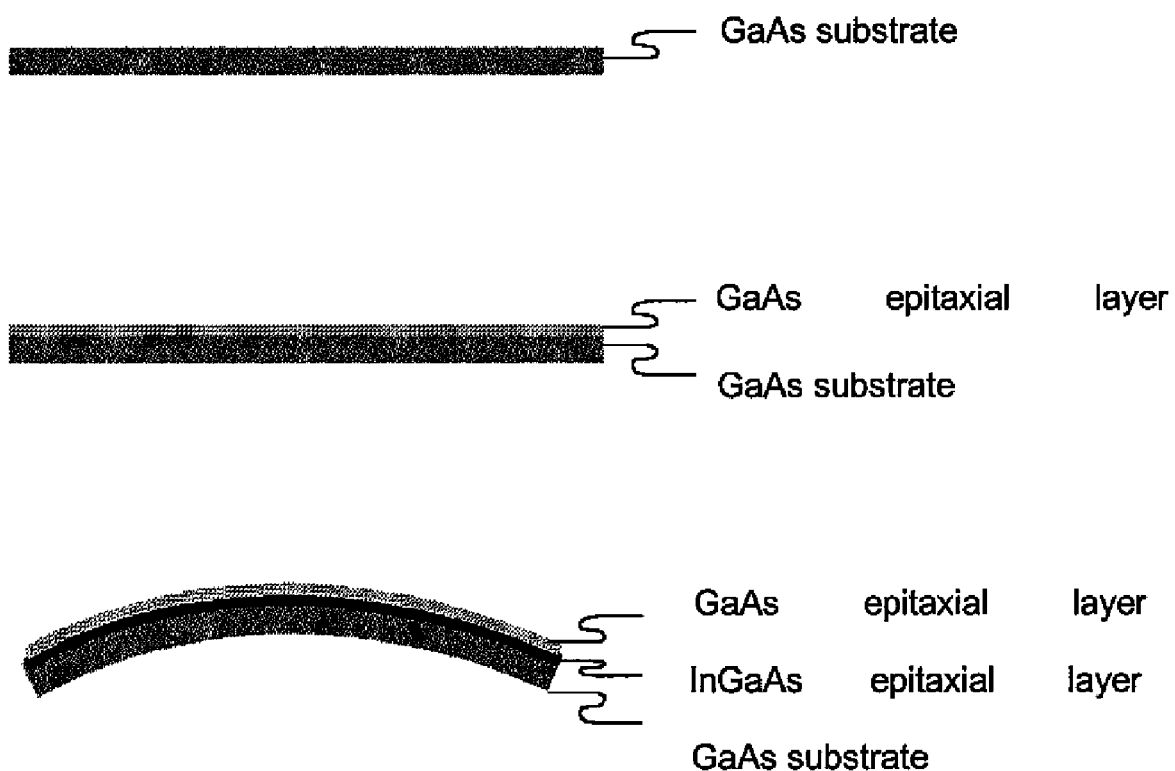
FIG. 4 is an illustration of the conventional compound semiconductor epitaxial substrate in which warpage occurs.

More specifically, layers other than an InGaAs channel layer 6 of FIG. 1 (a GaAs buffer layer 2, an AlGaAs buffer layer 3, n-AlGaAs electron supply layers 4 and 8, spacer layers 5 and 7, an undoped AlGaAs layer 9, an undoped GaAs layer 10, and a n-GaAs contact layer 11) are lattice-matched with the GaAs single crystal substrate 1. Since InGaAs is larger than GaAs in lattice constant, the InGaAs layer 6 acts as the lattice mismatch compound semiconductor layer. The InGaAs layer 6 undergoes compressive stress from the substrate and the other layers and exerts tensile stress on the GaAs single crystal substrate 1 and the other layers. As a result, warpage occurs in the epitaxial substrate. FIG. 4 is a schematic illustration of the warpage. Due to the tensile stress exerted on the substrate and the other layers by the InGaAs layer 6, the compound semiconductor epitaxial substrate warps so as to become convex upward. In this invention, to reduce such warpage, the stress compensation layer, which is smaller than the single crystal substrate in lattice constant and which exerts compressive stress on the other layers and the single crystal substrate, is formed on the same surface side as that of the lattice mismatch compound semiconductor layer of the single crystal substrate. By adjusting the lattice constant and thickness of the stress compensation layer, the extent of the warpage is controlled so as to be reduced. When the single crystal substrate is made of GaAs, examples of the compound semiconductor suitable for the stress compensation layer include InGaP, GaAsP, InAlP, SiGe, AlAsP, and AlGaAsP as materials whose lattice constant is slightly different from that of the single crystal substrate (GaAs) and whose layer thickness can be easily controlled.

Examples of the single crystal substrate include GaAs, GaP, InP, Si, Ge, SiC, GaN, AlN, and sapphire.

The lattice mismatch compound semiconductor layer differs from the single crystal substrate in lattice constant and does not have the occurrence of lattice relaxation. Examples of materials for the lattice mismatch compound semiconductor layer include InGaAs, InGaAsP, InGaP, InAs, GaAsSb, and InGaN. These substances are used alone or in combination thereof.

As the stress compensation layer, any can be used provided that the conditions described above are satisfied. The stress compensation layer can be suitably selected according to the materials for the single crystal substrate and the lattice mismatch compound semiconductor layer, that is, may be selected from, for example, InGaP, GaAsP, InAlP, SiGe, AlAsP, AlGaAsP, InGaAs, InAlP, and AlGaN.

In the compound semiconductor epitaxial substrate according to the invention, it is preferable that as respects the magnitude relation between the lattice constants of the single crystal substrate, the lattice mismatch compound semiconductor layer, and the stress compensation layer, the lattice constant of the lattice mismatch compound semiconductor layer be larger than that of the single crystal substrate, and the lattice constant of the stress compensation layer be smaller than that of the single crystal substrate. As examples of the combinations of materials for these layers, in order of the single crystal substrate—the lattice mismatch compound semiconductor layer—the stress compensation layer, the combinations of GaAs—InGaAs—AlGaAsP, GaAs—GaAsSb—GaAsP, InP—InGaAs—InGaP, GaN—InGaN—AlGaN, and SiC—InGaN—AlGaN are preferable and the combinations of GaAs—InGaAs—AlGaAsP, GaAs—GaAsSb—GaAsP, and InP—InGaAs—InGaP are more preferable.

The compound semiconductor epitaxial substrate may be manufactured by using, for example, a process including the steps of (1) epitaxially growing on the single crystal substrate a compound semiconductor layer I in which no lattice relaxation occurs and (2) epitaxially growing on the resultant compound semiconductor layer I a compound semiconductor layer II in which no lattice relaxation occurs (at this time, the lattice constant of the single crystal substrate Ls, the lattice constant of the compound semiconductor layer I L$_I$, and the lattice constant of the compound semiconductor layer II L$_{II}$ satisfy the formula (1b) or (2b)).

In the compound semiconductor epitaxial substrate obtained by using the above process, either the compound semiconductor layer I acts the lattice mismatch compound semiconductor layer and the compound semiconductor layer II acts as the stress compensation layer or the compound semiconductor layer I acts as the stress compensation layer and the compound semiconductor layer II acts as the lattice mismatch compound semiconductor layer.

In the latter case, examples of the compound semiconductor layer II include InGaAs, InGaAsP, InGaP, InAs, GaAsSb, and InGaN. Examples of the compound semiconductor layer I include InGaP, GaAsP, InAlP, SiGe, AlAsP, AlGaAsP, InGaAs, InAlP, and AlGaN. And furthermore, examples of the combinations of the single crystal substrate, the compound semiconductor layer II, and the compound semiconductor layer I include, in order of the single crystal substrate—the compound semiconductor layer II—the compound semiconductor layer I, GaAs—InGaAs—AlGaAsP, GaAs—GaAsSb—GaAsP, InP—InGaAs—InGaP, GaN—InGaN—AlGaN, and SiC—InGaN—AlGaN and preferably include GaAs—InGaAs—AlGaAsP, GaAs—GaAsSb—GaAsP, and InP—InGaAs—InGaP.

In the following description, the compound semiconductor layer II and the compound semiconductor layer I are referred to as the lattice mismatch compound semiconductor layer and the stress compensation layer respectively.

Next, a process for producing a compound semiconductor epitaxial substrate will be described with reference to the drawings. In this case, a process for producing a compound semiconductor epitaxial substrate for HEMTs which has a single crystal substrate made of GaAs and a lattice mismatch compound semiconductor layer made of InGaAs will be described.

To compare the compound semiconductor epitaxial substrate according to the invention with a conventional one, the layer structure of the conventional substrate is shown in FIG. 1. In FIG. 1, a GaAs single crystal substrate 1, a GaAs buffer layer 2, an AlGaAs buffer layer 3, a back side electron supply layer 4 which is a n-AlGaAs layer doped with n-type impurities, a back side AlGaAs spacer layer 5, and a channel layer 6 in which a two-dimensional electron gas is generated are formed in that order. The channel layer 6 is made of InGaAs and has a thickness of 40 Å to 180 Å. The thickness of the channel layer 6 may be changed in response to the In composition. The InGaAs channel layer 6 is larger than the GaAs single crystal substrate 1 in lattice constant and acts as the lattice mismatch compound semiconductor layer. The other layers are substantially lattice-matched with the GaAs single crystal substrate 1. In this figure, a front side AlGaAs spacer layer 7, a front side electron supply layer 8 which is a n-AlGaAs layer doped with n-type impurities, an undoped AlGaAs layer 9, an undoped GaAs layer 10, and a n-GaAs contact layer 11 are formed on the InGaAs channel layer 6 in that order.

Figure 2:
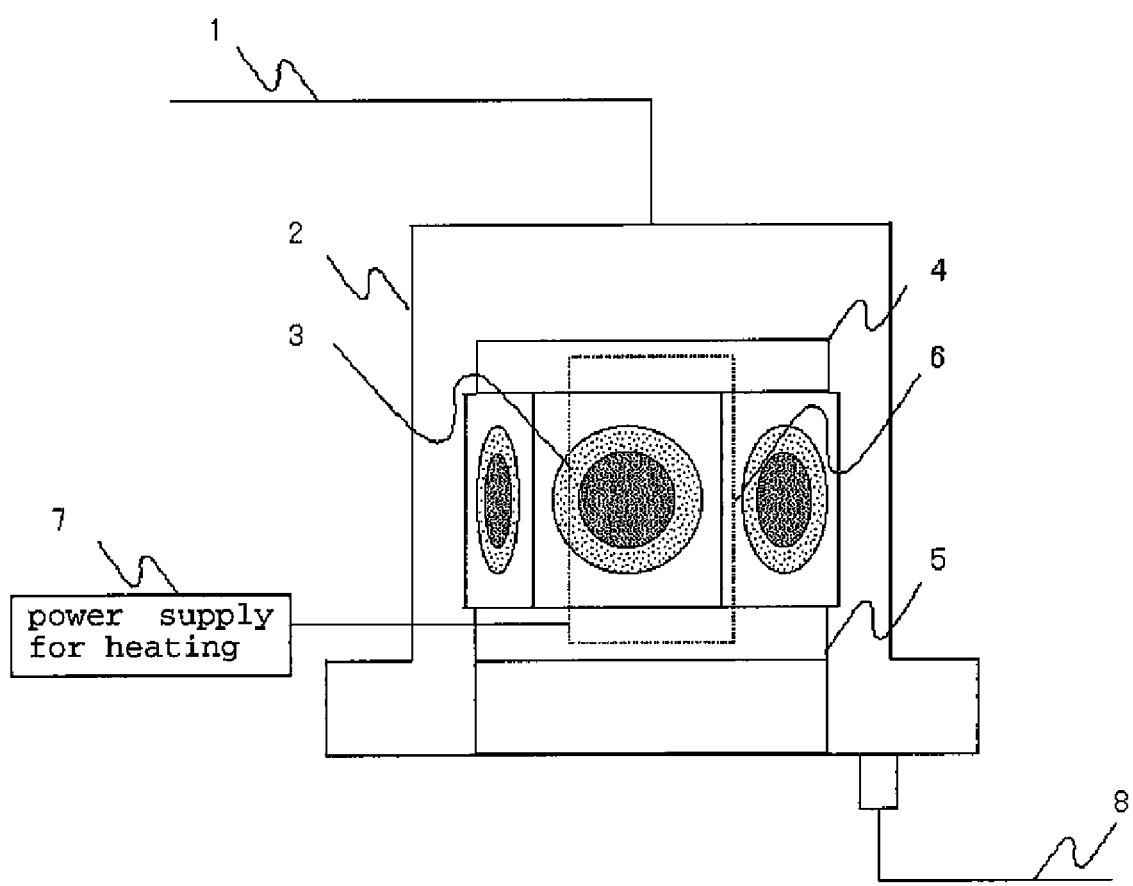
FIG. 2 shows the structure of a vapor deposition apparatus for semiconductor production.

The compound semiconductor layers from the GaAs buffer layer 2 to the n-GaAs contact layer 11 may be grown by using any conventional apparatus. An example of the apparatus for semiconductor production using MOCVD is shown in FIG. 2. Vapor deposition apparatus for semiconductor production has a feed line 1 and a reactor 2 to which a material gas is fed from a feeder (not shown) through the feed line 1. A susceptor 4 for use in heating the GaAs substrate 3 is provided inside the reactor 2. The susceptor 4 is in the shape of a polygonal prism and on its surface, the plural GaAs substrates (single crystal substrates) 3's are placed. The susceptor 4 is rotated by a rotating unit 5. An infrared lamp 6 for use in heating the susceptor 4 is provided inside the susceptor 4. By applying power to the infrared lamp 6 through the use of a power supply for heating 7, the GaAs substrates 3's are heated to a desired growth temperature. Through the heating, the material gas fed to the reactor 2 through the feed line 1 is pyrolyzed on the GaAs substrate 2 and a desired compound semiconductor layer is formed on the GaAs substrate 3 by vapor growth. Of the material gas fed to the reactor 2, unreacted gas is exhausted out of the reactor through an exhaust port 8 and sent to an exhaust gas treatment equipment.

The GaAs single crystal substrate 1 is a highly resistive semi-insulating GaAs single crystal substrate. As the GaAs single crystal substrate, a substrate is usually used which has been manufactured by using a LEC (liquid encapsulated Czochralski) method. And furthermore, as the GaAs single crystal substrate, substrates may be used which have been manufactured by using a VB (vertical Bridgeman) method, a VGF (vertical gradient freezing) method and so on.

After its surface has been washed, etched, rinsed, and dried, the GaAs single crystal substrate 1 is placed on the susceptor 4 in the reactor of the vapor deposition apparatus for semiconductor production. After the inside of the reactor has been substituted with high purity hydrogen, the application of heat to the GaAs single crystal substrate 1 is started. When the temperature of the GaAs single crystal substrate 1 has reached a desired growth temperature and the temperature has become stable, an arsenic material gas is fed into the reactor. When the GaAs layer is grown, a gallium material gas is fed following the feed of the arsenic material gas.

When the conventional AlGaAs buffer layer is grown, a gallium material gas and an aluminum material gas are fed following the feed of an arsenic material gas. With the compound semiconductor epitaxial substrate according to the invention having a layer structure shown in FIG. 7 (in cases where the structure is used for HEMTs, a n-GaAs contact layer is further formed on the uppermost layer and the substrate thus obtained is used; however, the formation of the contact layer makes it difficult to make a Hall measurement, and therefore the substrate on which no contact layer is formed and on which the Hall measurement can be made is herein shown), an $AlGaAs_{1-x}P_x$ layer is grown as the stress compensation layer instead of the AlGaAs buffer layer. In growing the $AlGaAs_{1-x}P_x$ layer, following the feed of an arsenic material gas and a phosphorous material gas, a gallium material gas and an aluminum material gas are fed.

And further, when the InGaAs layer is grown, a gallium material gas and an indium material gas are fed following the feed of an arsenic material gas.

The amounts of the individual materials to be fed and periods of time taken to supply the materials are controlled in order to make the compound semiconductor epitaxial substrate having the layer structure which includes the compound semiconductor layers having desired compositions, thicknesses, and carrier concentrations. After the growth of the desired layer structure has been completed, the supply of each material is stopped to stop the crystal growth, following which the reactor is cooled. After the cooling, the compound semiconductor epitaxial substrate is taken out of the reactor. By carrying out these steps, the growth of the compound semiconductor layers is completed.

As the arsenic material gas, arsenic trihydride ($AsH_3$) is usually used; however, alkylarsine may be used which is obtained by substituting hydrogen of arsine with alkyl groups whose carbon number is 1 to 4.

As the phosphorous material gas, phosphine ($PH_3$) is usually used.

As the gallium, aluminum, and indium source materials, a trialkylate or a trihydride is usually used which is obtained by bonding an alkyl group whose carbon number is 1 to 3 or hydrogen to each metal atom.

As the n-type impurity dopant of the electron supply layer, a hydride of silicon (Si), germanium (Ge), tin (Sn), sulfur (S), selenium (Se), or the like or an alkylate having alkyl groups whose carbon number is 1 to 3 of Si, Ge, Sn, S, Se, or the like is used usually.

Figure 7:
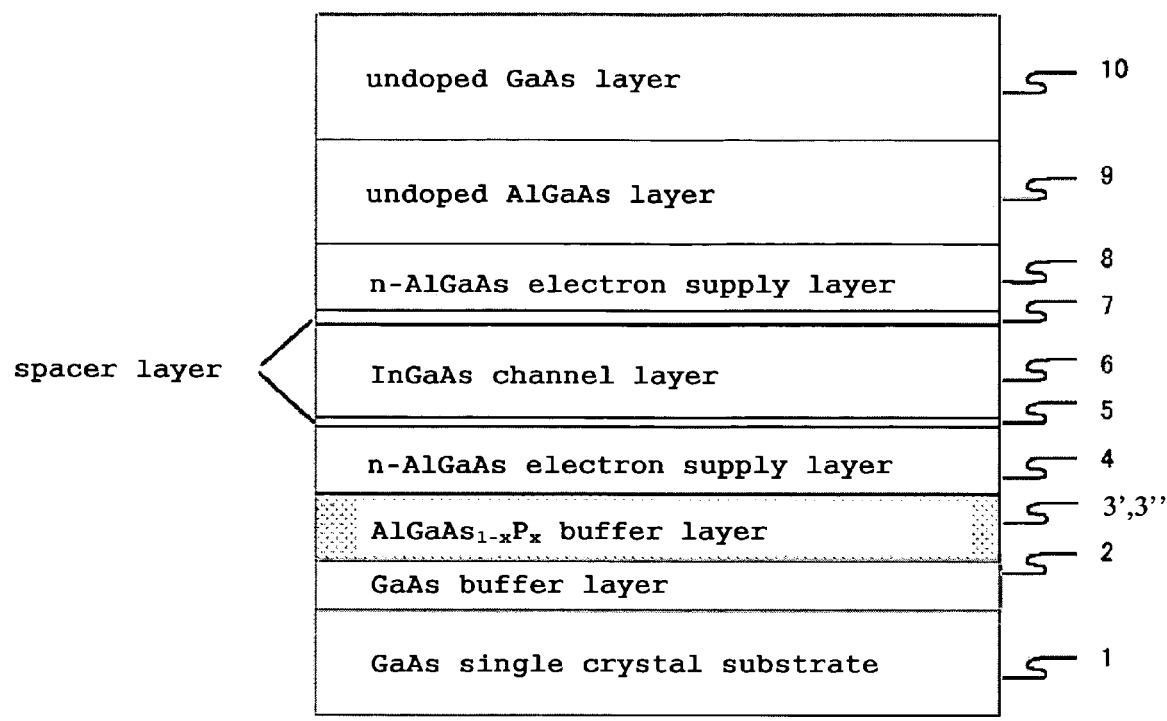
FIG. 7 shows the structure of a compound semiconductor epitaxial substrate for HEMTs according to the present invention which has an AlGaAs$_{1-x}$P$_x$ buffer layer and whose electrical properties have been evaluated.

For the compound semiconductor epitaxial substrate having the layer structure shown in FIG. 7, the 150 Å-thick InGaAs channel layer whose In composition is 0.20, and the 1500 Å-(or 3000 Å-)thick AlGaAsP layer, the relationship between phosphorus (P) content of the AlGaAsP layer (x of $AlGaAs_{1-x}P_x$) and the warpage of the substrate is determined by calculation. The calculation results are shown in FIG. 5.

The vertical axis represents the curvature radius of the substrate, and the horizontal axis phosphorus content of the AlGaAsP layer. When phosphorus (P) content of the AlGaAs buffer layer is zero, the curvature radius of the substrate is about 200 meters. When phosphorus (P) content of the AlGaAsP layer is increased, the curvature radius of the substrate is increased and the warpage is therefore reduced.

Figure 5:
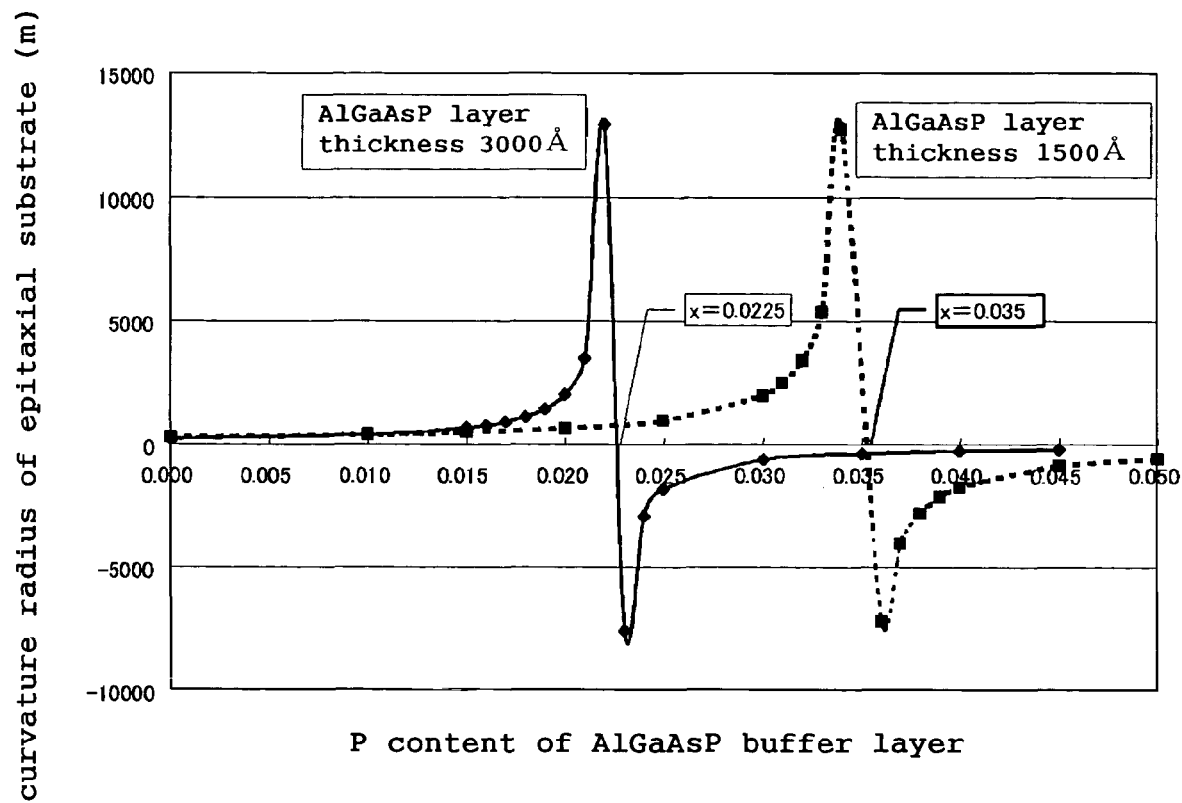
FIG. 5 is a graph showing the relationship between the curvature radius of a compound semiconductor epitaxial substrate and P content of an $AlGaAs_{1-x}P_x$ buffer layer.

As shown in FIG. 5, when phosphorus (P) content approaches a specific value from smaller values, the curvature radius of the substrate is abruptly increased to infinity, which means that the substrate is not warped. When phosphorus (P) content is further increased, the curvature radius of the substrate changes sign from a plus to a minus. This means that the orientation of the warpage changes (from the concave shape to the convex shape or from the convex shape to the concave shape).

As described above, in the compound semiconductor epitaxial substrate having the layer structure shown in FIG. 7 and the 150 Å-thick InGaAs channel layer whose In composition is 0.20, the extent of the warpage of the substrate is controlled by adjusting phosphorus (P) content of the AlGaAs buffer layer. As a consequence, the substrate is obtained in which no warpage is substantially present.

A semiconductor device according to the present invention includes the compound semiconductor epitaxial substrate described above. The semiconductor device usually includes the compound semiconductor epitaxial substrate and electrodes. The semiconductor device may be used as, for example, a HEMT and a HBT.

EXAMPLE

In the following, examples of the invention will be described in more detail; the invention is not limited to these examples.

Reference 1

Figure 3:
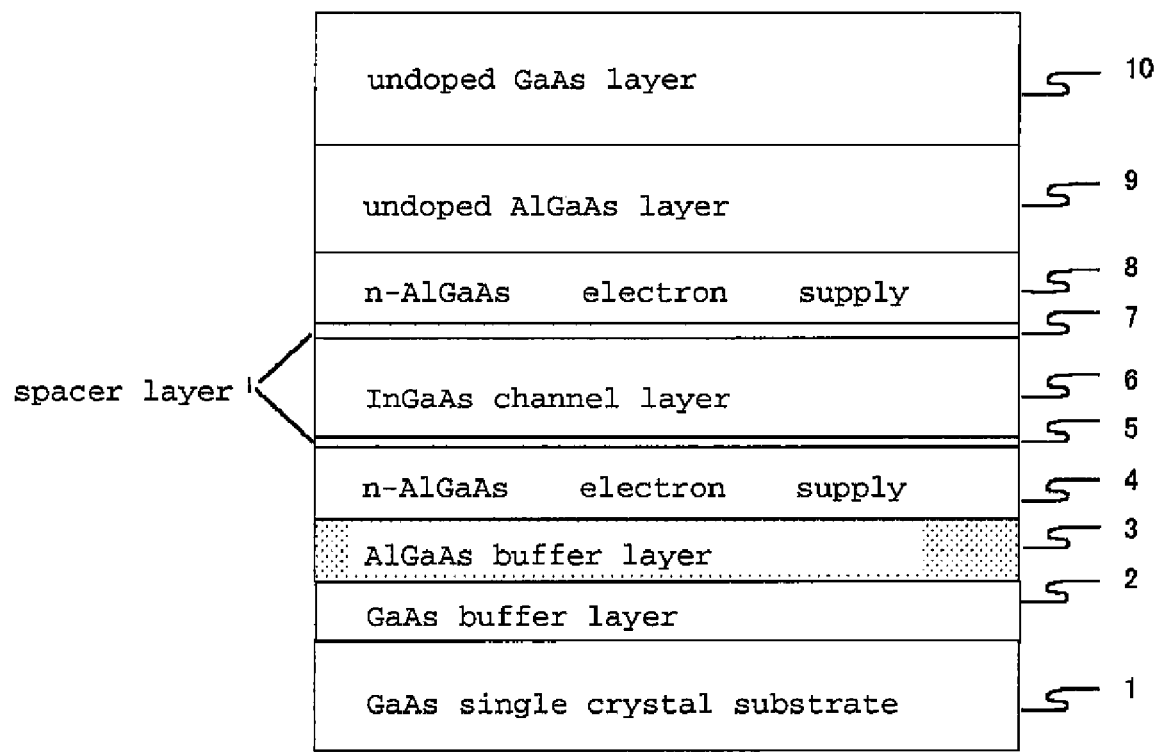
FIG. 3 shows the structure of a conventional compound semiconductor epitaxial substrate for HEMTs for use in evaluating electrical properties.

A compound semiconductor epitaxial substrate having a structure shown in FIG. 3 was grown using MOCVD. As its single crystal substrate, a semi-insulating GaAs substrate with a diameter of 3 inches was used. A channel layer had an In composition of 0.20 and a thickness of 150 Å. The lattice constant of the GaAs substrate was 5.653 Å. The lattice constant of $In_{0.20}Ga_{0.80}As$ was 5.734 Å and therefore was larger than that of GaAs. The lattice constant of $In_{0.20}Ga_{0.80}As$ was calculated from the lattice constants of GaAs and InAs according to Vegard's law. After the completion of the growth, the compound semiconductor epitaxial substrate was taken out of the reactor, and then its electrical properties (two-dimensional electron gas concentration and Hall mobility) were determined by using a van der Pauw method.

The two-dimensional electron gas concentration was $1.72 \times 10^{12}/cm^2$ and the Hall mobility was 6230 $cm^2/Vs$ at room temperature.

Figure 6:
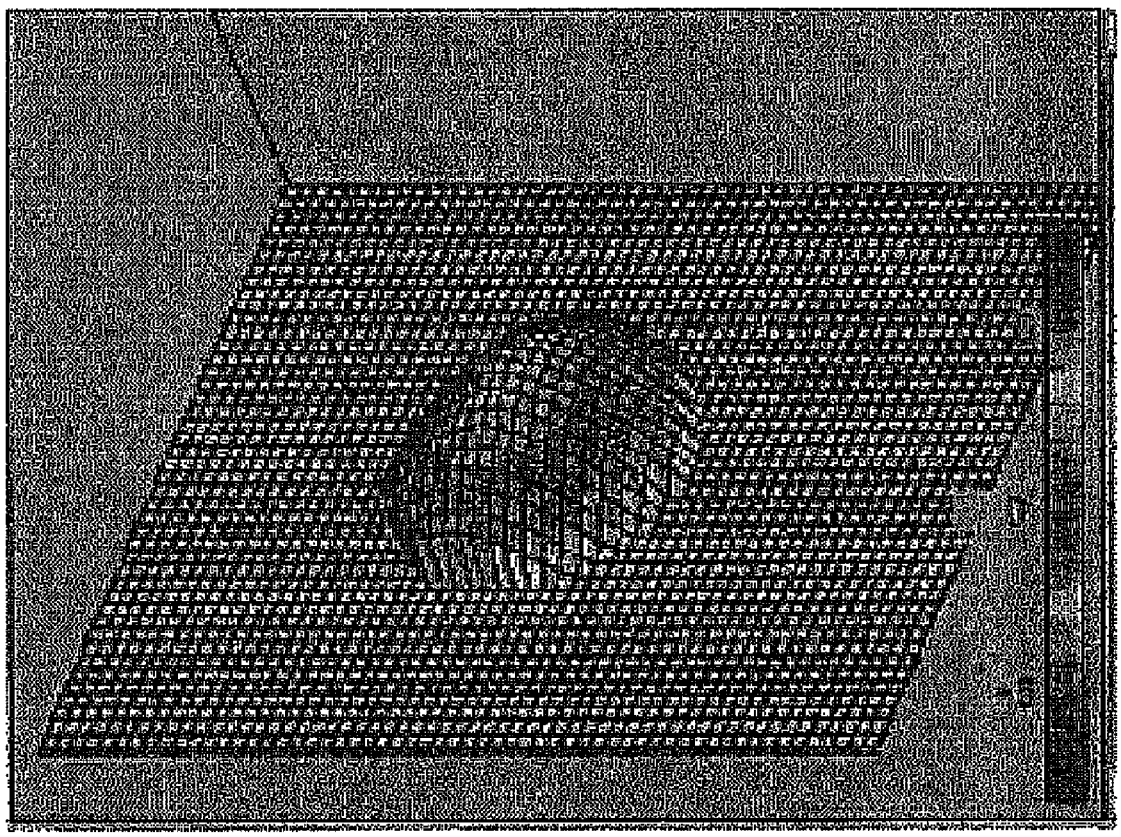
FIG. 6 shows evaluation results on warpage in the conventional HEMT whose AlGaAs buffer layer contains no P.
Figure 6:
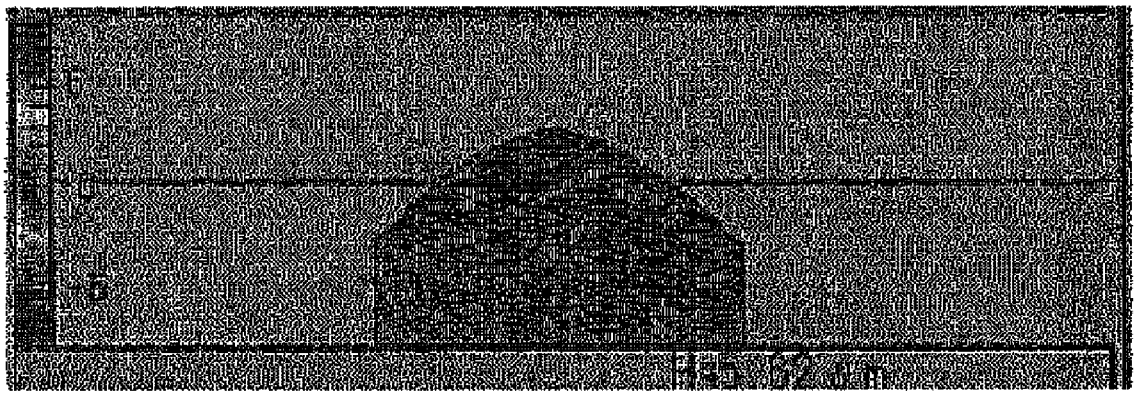

Furthermore, the extent of the warpage of the compound semiconductor epitaxial substrate was measured by using a commercial warpage measuring instrument. A bird's eye view and a cross-sectional view of the compound semiconductor epitaxial substrate are shown in FIG. 6. The compound semiconductor epitaxial substrate was warped into a convex shape due to tensile strain caused by the lattice mismatch compound semiconductor layer (the InGaAs layer).

The extent of the warpage in the compound semiconductor epitaxial substrate was expressed numerically. SORI, that is, the difference in height between the highest spot and lowest spot of the surface of the wafer was 5.62 μm.

Example 1

A compound semiconductor epitaxial substrate was produced by carrying out the same steps as those described in REFERENCE 1 except that the AlGaAs layer 3 included in the structure shown in FIG. 7 was replaced with an $AlGaAs_{0.9775}P_{0.0225}$ layer 3' (in which x of $AlGaAs_{1-x}P_x$ was set at 0.0225 and which acts as the stress compensation layer). The lattice constant of $AlGaAs_{0.9775}P_{0.0225}$ was 5.650 Å and therefore was smaller than that of GaAs (5.653 Å). The lattice constant of $AlGaAs_{0.9775}P_{0.0225}$ was calculated from the lattice constants of AlGaAs and AlGaP according to Vegard's law. The lattice constant of AlGaAs was calculated from the lattice constants of GaAs and AlAs. And further, the lattice constant of AlGaP was calculated from those of AlP and GaP.

The compound semiconductor epitaxial substrate thus obtained was equal in electrical properties to the substrate described in REFERENCE 1; that is, the replacement of the AlGaAs layer 3 with the $AlGaAs_{0.9775}P_{0.0225}$ layer 3' did not cause a reduction in its electrical properties. And further, the SORI in the compound semiconductor epitaxial substrate was 3.86 μm, and therefore was smaller than that in the substrate described in REFERENCE 1.

Example 2

A compound semiconductor epitaxial substrate was produced by carrying out the same steps as those described in REFERENCE 1 except that the AlGaAs layer 3 included in the structure shown in FIG. 7 was replaced with an $AlGaAs_{0.965}P_{0.035}$ layer 3" (in which x of $AlGaAs_{1-x}P_x$ was set at 0.035 and which acts as the stress compensation layer). The lattice constant of $AlGaAs_{0.965}P_{0.035}$ was 5.647 Å, and therefore was smaller than that of GaAs. The compound semiconductor epitaxial substrate thus obtained was equal in electrical properties to the substrate described in the REFERENCE 1 and had a SORI of 1.85 μm.

The invention claimed is:

1. A compound semiconductor epitaxial substrate having a HEMT structure, comprising a single crystal substrate, a lattice mismatch compound semiconductor layer and a stress compensation layer, wherein the lattice mismatch compound semiconductor layer and the stress compensation layer are disposed on the identical surface side of the single crystal substrate, there is no occurrence of lattice relaxation in the lattice mismatch compound semiconductor layer, as well as the stress compensation layer, and Ls representing the lattice constant of the single crystal substrate, Lm representing the lattice constant of the lattice mismatch compound semiconductor layer, and Lc representing the lattice constant of the stress compensation layer satisfy the formula (1a) or (2a)

$$Lm<Ls<Lc \quad (1a)$$

$$Lm>Ls>Lc \quad (2a);$$

wherein the lattice constants of Lm, Ls, and Lc are the values associated with each individual layer at natural, unstrained condition;

wherein the compound semiconductor epitaxial substrate comprises the single crystal layer, a buffer layer, an electron supply layer made of AlGaAs, a spacer layer, the lattice mismatch compound semiconductor layer in this order, and a part of the buffer layer is replaced with the stress compensation layer.

2. The compound semiconductor epitaxial substrate according to claim 1, wherein the single crystal substrate is selected from the group consisting of GaAs, GaP, InP, Si, Ge, SiC, GaN, AlN and sapphire.

3. The compound semiconductor epitaxial substrate according to claim 1, wherein the lattice mismatch compound semiconductor layer is at least one selected from the group consisting of InGaAs, InGaAsP, InGaP, InAs, GaAsSb, and InGaN.

4. The compound semiconductor epitaxial substrate according to claim 1, wherein the stress compensation layer is at least one selected from the group consisting of InGaP, GaAsP, InAlP, SiGe, AlAsP, AlGaAsP, InGaAs, InAlP, AlGaN.

5. A compound semiconductor device comprising the compound semiconductor epitaxial substrate according to any one of claims 1 to 4.

* * * * *